United States Patent [19]
Hashimoto et al.

[11] Patent Number: 5,532,871
[45] Date of Patent: Jul. 2, 1996

[54] TWO-WAVELENGTH ANTIREFLECTION FILM

[75] Inventors: Shigeru Hashimoto; Akihiko Yokoyama, both of Yokohama, Japan

[73] Assignee: Canon Kabushiki Kaisha, Tokyo, Japan

[21] Appl. No.: 156,694

[22] Filed: Nov. 24, 1993

[30] Foreign Application Priority Data

Nov. 25, 1992 [JP] Japan .................................. 4-337945
Jun. 2, 1993 [JP] Japan .................................. 5-156252

[51] Int. Cl.$^6$ .............................. G02B 5/08; G02B 5/28; G02B 3/00
[52] U.S. Cl. ........................ 359/359; 359/589; 359/653; 359/722
[58] Field of Search .................. 359/359, 589, 359/653, 722

[56] References Cited

U.S. PATENT DOCUMENTS 4,997,241 3/1991 Muratomi ............................ 359/589

FOREIGN PATENT DOCUMENTS 63-113501 5/1988 Japan .
2-12605 1/1990 Japan .
2127601 5/1990 Japan .

*Primary Examiner*—Georgia Y. Epps
*Assistant Examiner*—Evelyn A. Lester
*Attorney, Agent, or Firm*—Fitzpatrick Cella Harper & Scinto

[57] ABSTRACT

A two-wavelength antireflection film includes a substrate and an alternate film. The alternate film consists of alternately laminated layers of a low refractive index material and an intermediate refractive index material, in order from a light entrance side to the surface of the substrate. The low refractive index material is at least a member selected from the group consisting of $MgF_2$, $SiO_2$, $BaF_2$, LiF, $SrF_2$, $AlF_3$, NaF, a mixture thereof and a compound thereof. The intermediate refractive index material is at least a member selected from the group consisting of $Al_2O_3$, $LaF_3$, $NdF_3$, $YF_3$, a mixture thereof and a compound thereof.

13 Claims, 9 Drawing Sheets

TWO-WAVELENGTH ANTIREFLECTION FILM

BACKGROUND OF THE INVENTION

1. Field of the Invention

The present invention relates to a two-wavelength antireflection film, and more particularly to a two-wavelength antireflection film capable of effective antireflection in two wavelength regions, for example, in an ultraviolet wavelength region of 200–300 nm and a visible wavelength region of 600–700 nm.

2. Related Background Art

In recent semiconductor device production, for achieving a higher resolution, there have been proposed various projection exposure apparatus (steppers) utilizing the exposure light of a wavelength shorter than that of g- or i-line, for example, the ultraviolet light of a wavelength of 248 nm emitted from an excimer laser.

Alternatively, in order to achieve high precise relative alignment of the reticle and the wafer, there have been proposed various alignment systems employing light where the wavelength is different from that of the exposing light and which is within the visible wavelength region in order to enable observation of the wafer surface but is non-actinic to the photoresist, for example, the light of a wavelength of 632.8 nm emitted from a He-Ne laser.

In such projection exposure apparatus, the faces of the mirrors and lenses constituting the optical systems therein are provided with thin films of predetermined transmittances (or reflectances) in the ultraviolet and visible wavelength regions. For example the Japanese Patent Laid-open Application Nos. 63-113501, 2-127601 and 2-12605 propose antireflection films capable of certain antireflection in the ultraviolet and visible wavelength regions.

The conventional antireflection film is composed, in a part thereof, of a highly refractive material of a refractive index of 1.9 or higher, such as $Y_2O_3$.

A highly refractive material, such as $Y_2O_3$, generally has a high absorbance in the ultraviolet region below 300 nm. For this reason, when a KrF excimer laser (wavelength 248 nm) is employed as the light source for achieving a high resolution in the projection exposure apparatus (stepper) for the semiconductor device production, the transmittance of the projection lens is lowered, and the light absorption raises the temperature of the optical elements, thereby causing a variation in the optical performance thereof.

Besides the light absorption causes damage to the antireflection film, or a change in the film configuration, whereby the desired spectral characteristics (antireflectivity) can no longer be obtained.

SUMMARY OF THE INVENTION

The object of the present invention is to provide a two-wavelength antireflection film which is optically stable with little light absorption and is capable of effective antireflection principally for the light in an ultraviolet wavelength region less than 300 nm and a visible wavelength region of 600 to 700 nm, by suitable selection of the film structure and the refractive indexes of the materials constituting said film, and which is adapted for use in optical elements (lenses and mirrors) employed in the projection exposure apparatus (stepper), for example, for semiconductor device production.

The two-wavelength antireflection film of the present invention is featured by alternate lamination, in succession from the light entrance side to the substrate surface, of thin films of a low refractive index material and an intermediate refractive index material, thereby achieving antireflection to the lights of two wavelengths, in the ultraviolet wavelength region and in the visible wavelength region. It is further featured that the low refractive index material is at least a component selected from a group consisting of $MgF_2$, $SiO_2$, $BaF_2$, LiF, $SrF_2$, $AlF_3$, NaF, mixtures and compounds thereof, and the intermediate refractive index material is at least a component selected from a group consisting of $Al_2O_3$, $LaF_3$, $NdF_3$, $YF_3$, mixtures and compounds thereof, and that the low refractive index material and the intermediate refractive index materials are alternately laminated in 4 to 7 layers.

Furthermore, the two-wavelength antireflection film of the present invention is featured by alternate lamination of the low refractive index material and the intermediate refractive index material in succession from the light entrance side to the substrate surface, with optical thicknesses, for the design wavelength $\lambda_0$, of $0.2\lambda_0$ to $0.4\lambda_0$ for a first layer, $0.05\lambda_0$ to $0.2\lambda_0$ for a second layer, $0.2\lambda_0$ to $0.4\lambda_0$ for a third layer, and $0.4\lambda_0$ to $0.6\lambda_0$ for a fourth layer, thereby achieving antireflection to the lights of two wavelengths.

It is furthermore featured by the presence, next to the fourth layer, of an undercoat layer of the low refractive index material of the optical thickness of an integral multiple of $0.5\lambda_0$.

Also the two-wavelength antireflection film of the present invention is featured by alternate lamination of the low refractive index material and the intermediate refractive index material in succession from the light entrance side to the substrate surface, with optical thickness, for the central wavelength $\lambda_0$, of $0.2\lambda_0$ to $0.4\lambda_0$ for a first layer, $0.05\lambda_0$ to $0.2\lambda_0$ for a second layer, $0.2\lambda_0$ to $0.4\lambda_0$ for a third layer, $0.9\lambda_0$ to $1.1\lambda_0$ for a fourth layer, $0.2\lambda_0$ to $0.4\lambda_0$ for a fifth layer, and $0.4\lambda_0$ to $0.6\lambda_0$ for a sixth layer, thereby achieving antireflection for the lights of two wavelengths.

It is furthermore featured by the presence, next to the sixth layer, of an undercoat layer of the optical thickness of an integral multiple of $0.5\lambda_0$.

Also the two-wavelength antireflection film of the present invention is featured by 4-layered film laminated on the surface of a substrate and composed, in the order from the farthest side from the substrate surface, of a first layer of a low refractive index material, a second layer of a high refractive index material, a third layer of a low refractive index material, and a fourth layer of an intermediate refractive index material, wherein the optical thickness $D_1$, $D_2$, $D_3$, $D_4$ respectively of the first, second, third and fourth layers are in the following ranges:

$0.2\lambda_0 \leq D_1 \leq 0.4\lambda_0$,
$0.04\lambda_0 \leq D_2 \leq 0.15\lambda_0$,
$0.4\lambda_0 \leq D_3 \leq 0.6\lambda_0$,
$0.4\lambda_0 \leq D_4 \leq 0.6\lambda_0$, wherein $\lambda_0$ is the design wavelength.

The intermediate refractive index material means a material having a refractive index larger than 1.55 but smaller than 1.90 for the light of a wavelength of 248 nm, such as $Al_2O_3$, $CaF_2$, $NdF_3$, $YF_3$ or a mixture thereof. The high refractive index material means a material having a refractive index equal to or larger than 1.90 for the above-mentioned light, such as $Y_2O$, $HfO_2$ or a mixture thereof. Also the low refractive index material means a material having a refractive index equal to or smaller than 1.55 for the above-mentioned light, such as $MgF_2$, $SiO_2$, $BaF_2$, LiF, $SiF_2$, $AlF_3$, NaF or a mixture thereof. A two-wavelength antireflection film with significantly widened antireflection property for the ultraviolet light can be obtained by selecting the materials of appropriate refractive indexes from those mentioned above and designing the 4-layered antireflection film with optical thickness within the above-mentioned ranges. Also the ultraviolet light absorption can be significantly lowered, since the layer of the high refractive index material, having strong absorption to the ultraviolet light, is extremely thin.

DETAILED DESCRIPTION OF THE PREFERRED EMBODIMENTS

Figure 1:
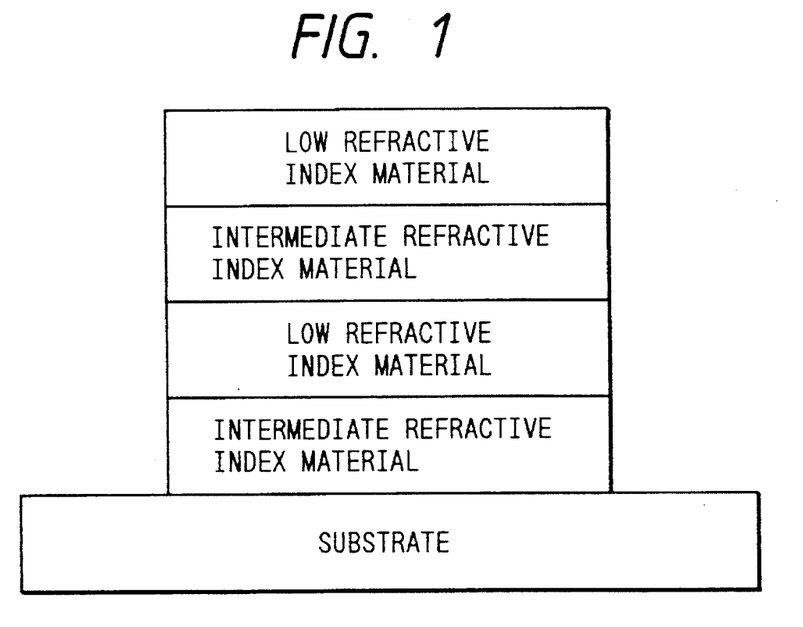
FIG. 1 is a schematic cross-sectional view showing the structure of the two-wavelength antireflection film of the present invention.

As shown in FIG. 1, the two-wavelength antireflection film of the present invention comprises, in the order from the light entrance side to the substrate surface, alternately laminated thin films of a low refractive index material and an intermediate refractive index material, thereby achieving antireflection to the lights of two wavelengths, in the ultraviolet region and in the visible wavelength region.

Tables 1 to 8 show examples of film configuration in embodiments 1–8 of the two-wavelength antireflection film of the present invention.

These embodiments employ substrates of synthetic quartz (having a refractive index of 1.51 at a wavelength of 248 nm), and the two-wavelength antireflection film is composed of 4 to 7 laminated layers of thin films, numbered as the 1st, 2nd, ..., layers from the light entrance side (air side). These embodiments employ 4 to 7 layers because a larger number of layers requires a longer time in film formation (evaporation) and results in a larger fluctuation.

The lights of two wavelengths, considered as the objects of antireflection, are the light of a wavelength of 248 nm (emitted from the KrF excimer laser) in the ultraviolet region of 200 to 300 nm, and the light of a wavelength of 632.8 nm (emitted from the He-Ne laser) in the visible region of 600 to 700 nm.

The antireflection films of the present embodiments as shown in Tables 1–8 do not employ a high refractive index material but consist of alternate lamination of 4 to 7 layers of a low refractive index material and an intermediate refractive index material, which have a relatively low absorption in the ultraviolet region and are still effective in the visible region. The films can be formed by known film-forming methods, such as vacuum evaporation, ion plating or sputtering.

The low refractive index material means a material having a refractive index not exceeding 1.55 at the wavelength of 248 nm, such as $MgF_2$, $SiO_2$, $BaF_2$, LiF, $SrF_2$, $AlF_3$, NaF, a mixture or a compound thereof.

The intermediate refractive index material means a material having a refractive index larger than 1.55 but smaller than 1.90 at the wavelength of 248 nm, such as $Al_2O_3$, $LaF_3$, $NdF_3$, $YF_3$, a mixture or a compound thereof.

The high refractive index material means a material having a refractive index equal to or larger than 1.90, such as $Y_2O_3$, $HfO_2$ or $ZrO_2$.

In the following there will be explained features of the film configurations of the embodiments.

In general, the film thickness and the number of films (layers) of the multi-layered antireflection film vary according to the desired optical characteristics and the refractive indexes of the materials to be employed.

In practice, the number of layers is limited to 4 to 7, because a larger number of layers will require a longer time of film formation and will lead to a larger fluctuation in the manufacture.

In the embodiment with four layers, with respect to the design wavelength $\lambda_0$ in the ultraviolet region and in the order from the light entrance side (air side) to the substrate side, there are provided a 1st layer of the low refractive index material with an optical thickness of $0.2\lambda_0$ to $0.4\lambda_0$, a 2nd layer of the intermediate refractive index material of an optical thickness of $0.05\lambda_0$ to $0.2\lambda_0$, a 3rd layer of the low refractive index material of an optical thickness of $0.2\lambda_0$ to $0.4\lambda_0$, and a 4th layer of the intermediate refractive index material of an optical thickness of $0.4\lambda_0$ to $0.6\lambda_0$.

Similarly, in case of 6-layered configuration, in the order from the light entrance side, there are provided a 1st layer of the low refractive index material with an optical thickness of $0.2\lambda_0$ to $0.4\lambda_0$, a 2nd layer of the intermediate refractive index material of an optical thickness of $0.05\lambda_0$ to $0.2\lambda_0$, a 3rd layer of the low refractive index material of an optical thickness of $0.2\lambda_0$ to $0.4\lambda_0$, a 4th layer of the intermediate refractive index material of an optical thickness of $0.9\lambda_0$ to $1.1\lambda_0$, a 5th layer of the low refractive index material of an optical thickness of $0.2\lambda_0$ to $0.4\lambda_0$, and a 6th layer of the intermediate refractive index material of an optical thickness of $0.4\lambda_0$ to $0.6\lambda_0$.

Figure 11:
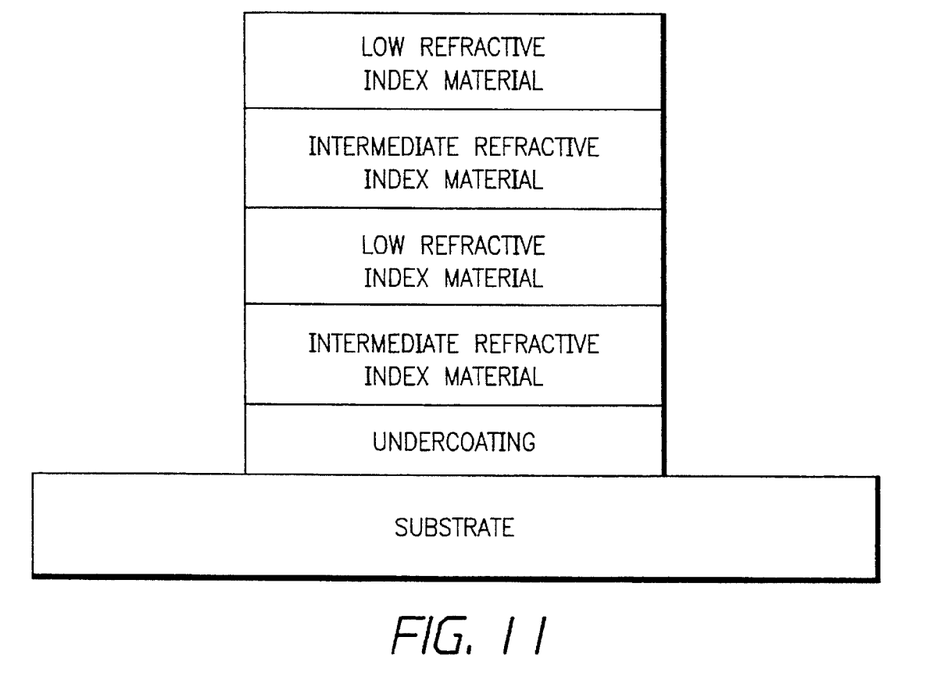
FIG. 11 is an embodiment showing four layers of films and an undercoating.
Figure 13:
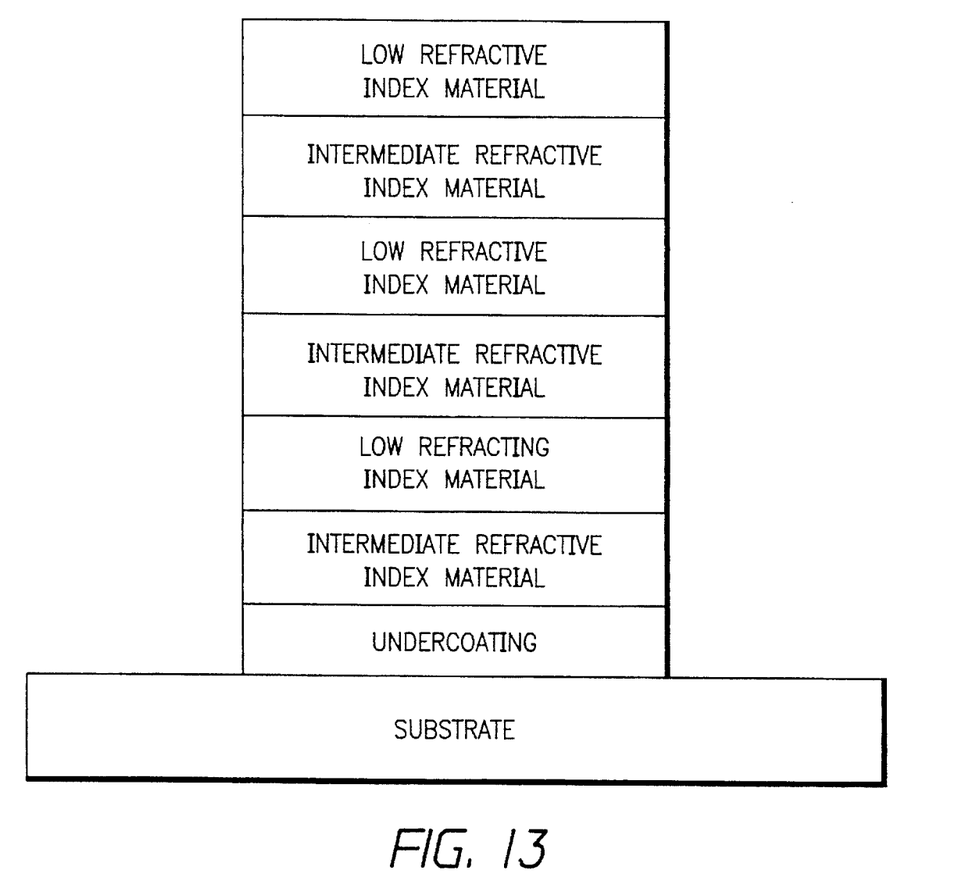
FIG. 13 is an embodiment showing six layers of films and an undercoating.

In these embodiments with 4- or 6-layered configuration, there may further be provided, next to the 4th or 6th layer, an undercoat layer of the low refractive index material of an optical thickness of an integral multiple of about $0.5\lambda_0$ for attaining similar effects. In these cases the film has 5 or 7 layers in total shown in FIGS. 11 and 13.

In the following there will be shown, in Tables 1 to 8, specific examples 1 to 8 of the configuration of the two-wavelength antireflection film of the present embodiments.

Figure 6:
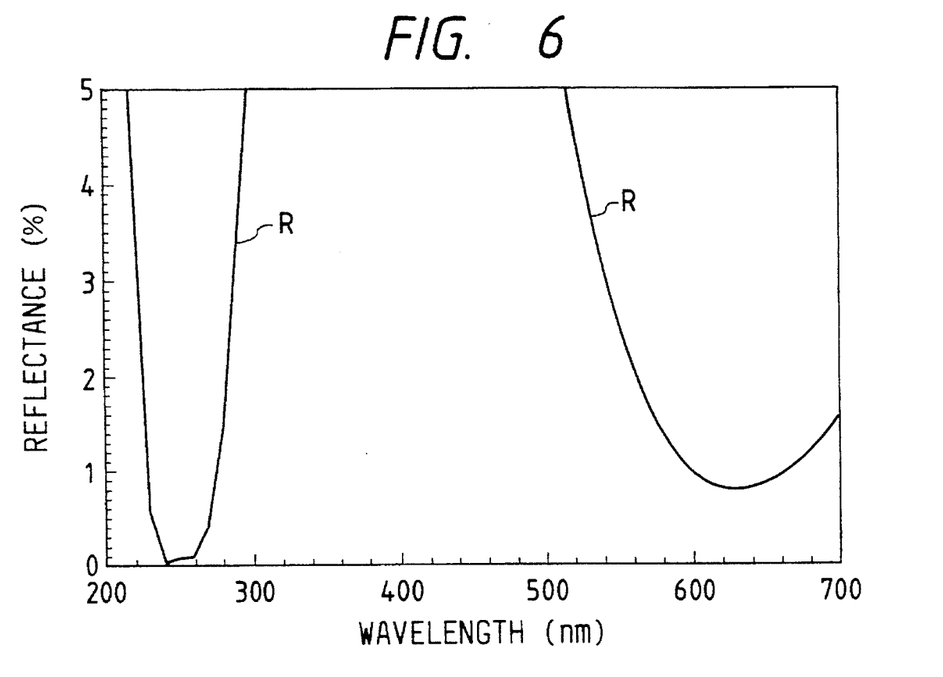
FIG. 6 is a chart showing spectral characteristics of an embodiment 6 of the two-wavelength antireflection film of the present invention.
Figure 14:
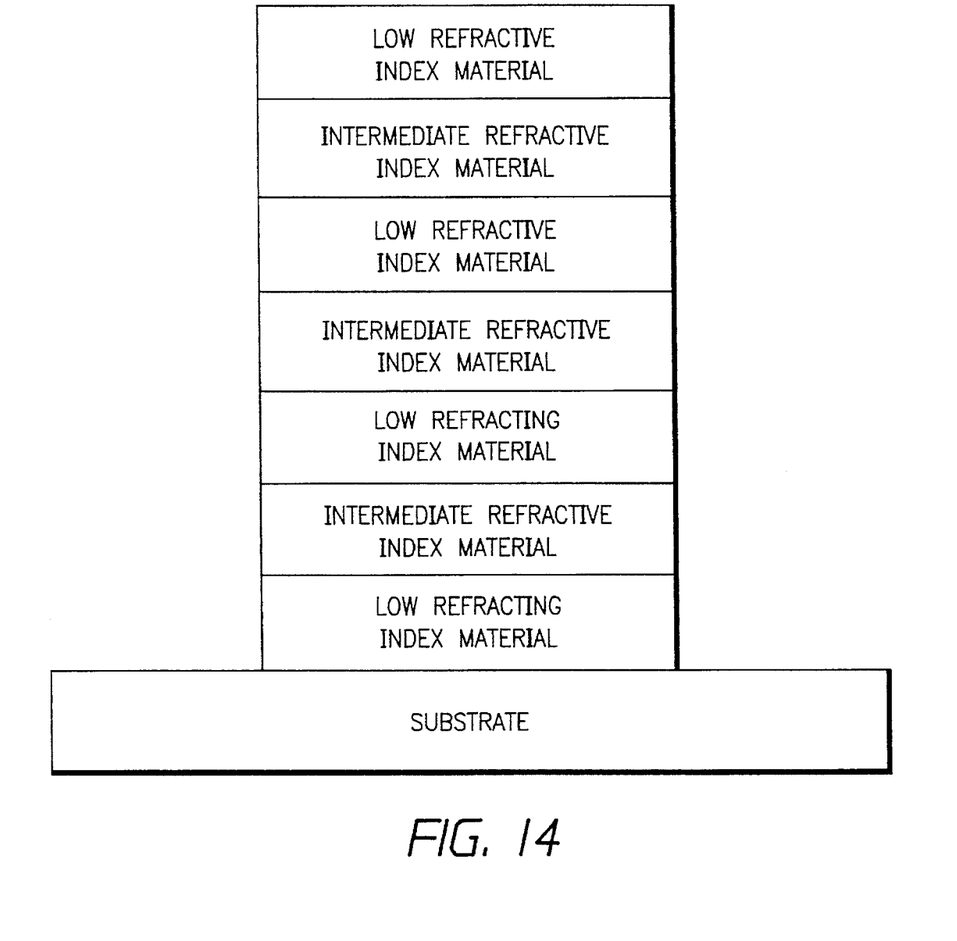
FIG. 14 is an embodiment showing seven layers of films.

The films shown in Tables 1 to 5, 7 and 8 were formed by vacuum evaporation, while that shown in FIG. 6 was formed by sputtering. Each of the films shown in Tables 1 and 3 to 6 comprises 4 layers on the substrate of synthetic quartz, while the film shown in Table 2 has 5 layers in total, including an undercoat layer ($SiO_2$, refractive index 1.51, optical thickness $0.5\lambda_0$) in addition to the film configuration shown in Table 1. The film shown in Table 7 comprises 6 layers on the substrate of synthetic quartz, while the film shown in Table 8 has 7 layers in total shown in FIG. 14, including an undercoat layer ($SiO_2$, refractive index 1.51, optical thickness $0.5\lambda_0$) in addition to the film configuration shown in Table 7.

Figure 2:
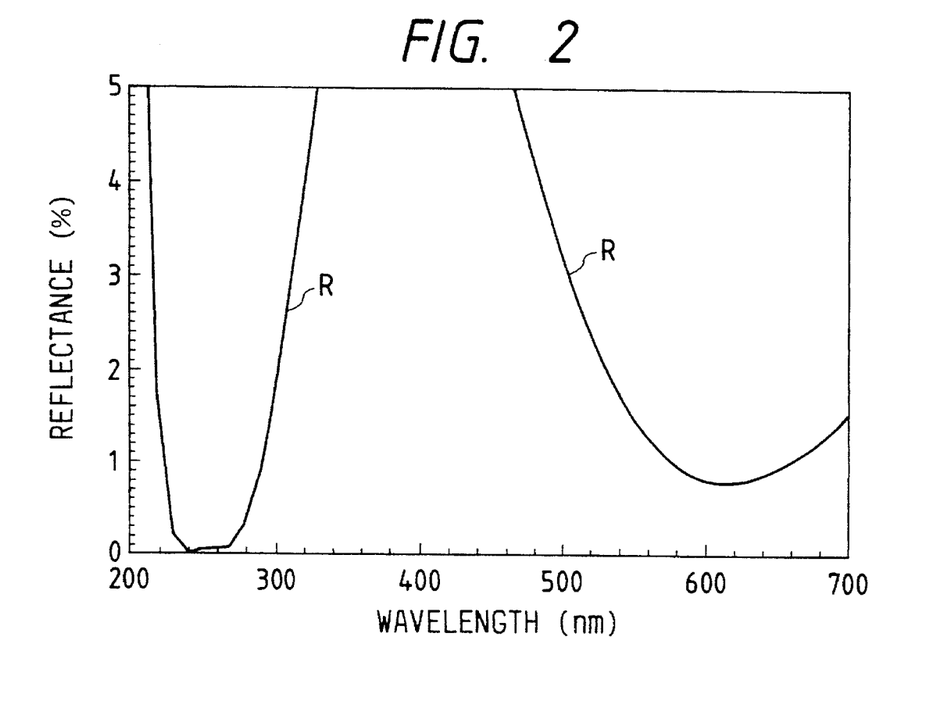
FIG. 2 is a chart showing spectral characteristics of embodiments 1, 2 of the two-wavelength antireflection film of the present invention.
Figure 3:
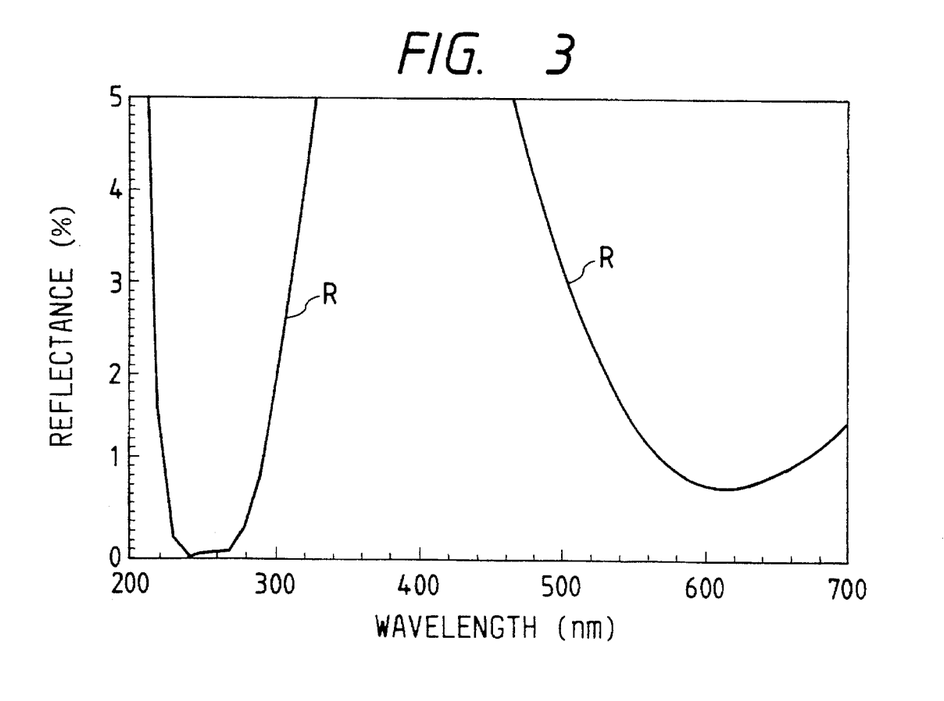
FIG. 3 is a chart showing spectral characteristics of an embodiment 3 of the two-wavelength antireflection film of the present invention.
Figure 4:
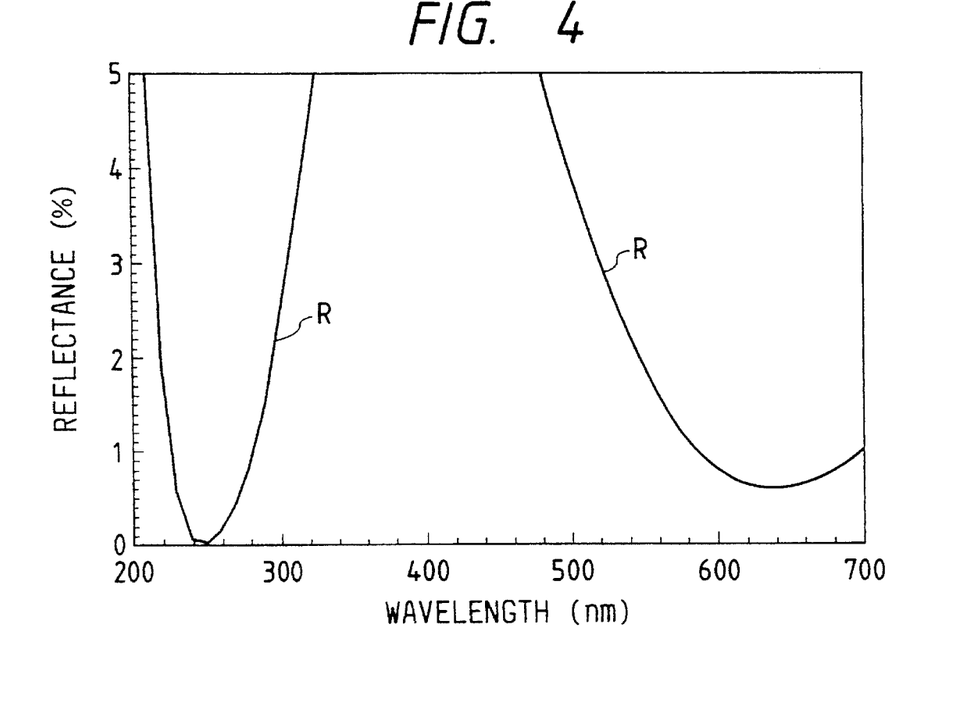
FIG. 4 is a chart showing spectral characteristics of an embodiment 4 of the two-wavelength antireflection film of the present invention.
Figure 5:
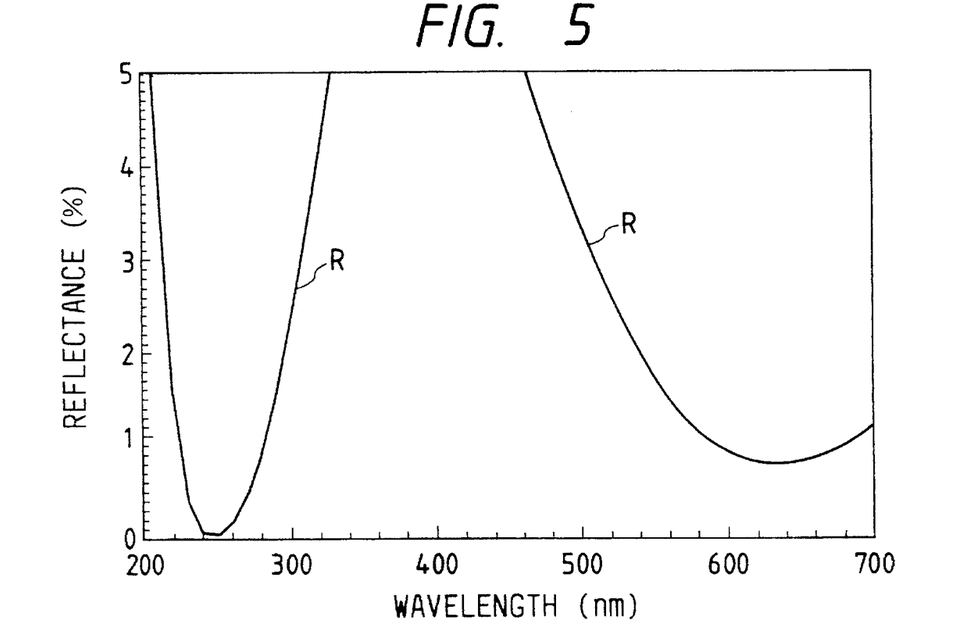
FIG. 5 is a chart showing spectral characteristics of an embodiment 5 of the two-wavelength antireflection film of the present invention.
Figure 7:
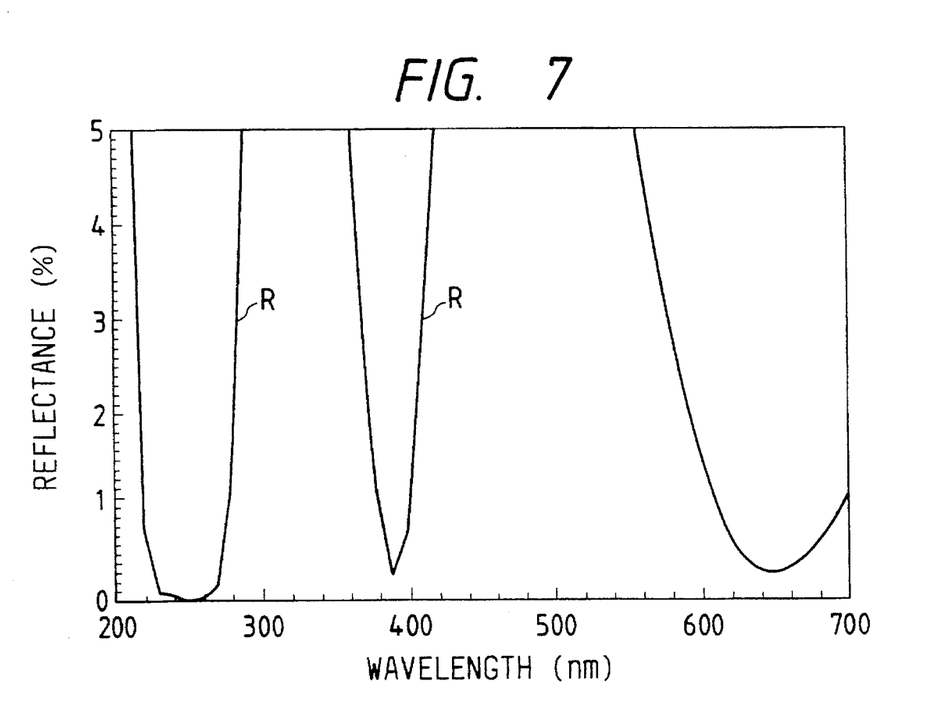
FIG. 7 is a chart showing spectral characteristics of embodiments 7, 8 of the two-wavelength antireflection film of the present invention.

The spectral reflectances in the film configurations shown in Tables 1 and 2 (examples 1, 2) are shown in FIG. 2, while those of the film configurations shown in Tables 3 to 6 (examples 3 to 6) are shown in FIGS. 3 to 6, and those of the film configurations shown in Tables 7 and 8 (examples 7, 8) are shown in FIG. 7. In these charts, R indicates the reflectance.

In the examples 1 to 8 shown in Tables 1 to 8, the optical elements showed almost no absorbance at $\lambda_0=248$ nm, with transmittances at least equal to 99.8%.

Also these optical elements did not show any damage, after irradiation with $10^8$ pulses by a KrF excimer laser, with a power of 50 $mJ/cm^2$.

TABLE 1

$\lambda_0 = 248$ nm, incident angle 0°

| | material | ref. index (n) | opt. thickness (nd) |
|---|---|---|---|
| entrance medium | air | 1.00 | |
| 1st layer | $MgF_2$ | 1.39 | $0.29\lambda_0$ |
| 2nd layer | $Al_2O_3$ | 1.74 | $0.14\lambda_0$ |
| 3rd layer | $SiO_2$ | 1.51 | $0.32\lambda_0$ |
| 4th layer | $Al_2O_3$ | 1.74 | $0.51\lambda_0$ |
| exit medium (substrate) | syn. quartz | 1.51 | |

TABLE 2

$\lambda_0 = 248$ nm, incident angle 0°

| | material | ref. index (n) | opt. thickness (nd) |
|---|---|---|---|
| entrance medium | air | 1.00 | |
| 1st layer | $MgF_2$ | 1.39 | $0.29\lambda_0$ |
| 2nd layer | $Al_2O_3$ | 1.74 | $0.14\lambda_0$ |
| 3rd layer | $SiO_2$ | 1.51 | $0.32\lambda_0$ |
| 4th layer | $Al_2O_3$ | 1.74 | $0.51\lambda_0$ |
| 5th layer | $SiO_2$ | 1.51 | $0.50\lambda_0$ |
| exit medium (substrate) | syn. quartz | 1.51 | |

TABLE 3

$\lambda_0 = 248$ nm, incident angle 0°

| | material | ref. index (n) | opt. thickness (nd) |
|---|---|---|---|
| entrance medium | air | 1.00 | |
| 1st layer | $MgF_2$ | 1.39 | $0.34\lambda_0$ |
| 2nd layer | $Al_2O_3$ | 1.74 | $0.08\lambda_0$ |
| 3rd layer | $MgF_2$ | 1.39 | $0.33\lambda_0$ |
| 4th layer | $Al_2O_3$ | 1.74 | $0.52\lambda_0$ |
| exit medium (substrate) | syn. quartz | 1.51 | |

TABLE 4

$\lambda_0 = 248$ nm, incident angle 0°

| | material | ref. index (n) | opt. thickness (nd) |
|---|---|---|---|
| entrance medium | air | 1.00 | |
| 1st layer | $MgF_2$ | 1.39 | $0.31\lambda_0$ |
| 2nd layer | $NdF_3$ | 1.66 | $0.17\lambda_0$ |
| 3rd layer | $MgF_2$ | 1.39 | $0.24\lambda_0$ |
| 4th layer | $NdF_3$ | 1.66 | $0.54\lambda_0$ |
| exit medium (substrate) | syn. quartz | 1.51 | |

TABLE 5

$\lambda_0 = 248$ nm, incident angle 0°

| | material | ref. index (n) | opt. thickness (nd) |
|---|---|---|---|
| entrance medium | air | 1.00 | |
| 1st layer | $MgF_2$ | 1.39 | $0.31\lambda_0$ |
| 2nd layer | $LaF_3$ | 1.62 | $0.16\lambda_0$ |
| 3rd layer | $MgF_2$ | 1.39 | $0.24\lambda_0$ |
| 4th layer | $LaF_3$ | 1.62 | $0.53\lambda_0$ |
| exit medium (substrate) | syn. quartz | 1.51 | |

TABLE 6

$\lambda_0 = 248$ nm, incident angle 0°

| | material | ref. index (n) | opt. thickness (nd) |
|---|---|---|---|
| entrance medium | air | 1.00 | |
| 1st layer | $SiO_2$ | 1.51 | $0.27\lambda_0$ |
| 2nd layer | $Al_2O_3$ | 1.85 | $0.16\lambda_0$ |
| 3rd layer | $SiO_2$ | 1.51 | $0.33\lambda_0$ |
| 4th layer | $Al_2O_3$ | 1.85 | $0.47\lambda_0$ |
| exit medium (substrate) | syn. quartz | 1.51 | |

TABLE 7

$\lambda_0 = 248$ nm, incident angle 0°

| | material | ref. index (n) | opt. thickness (nd) |
|---|---|---|---|
| entrance medium | air | 1.00 | |
| 1st layer | $MgF_2$ | 1.39 | $0.27\lambda_0$ |
| 2nd layer | $Al_2O_3$ | 1.74 | $0.14\lambda_0$ |
| 3rd layer | $SiO_2$ | 1.51 | $0.35\lambda_0$ |
| 4th layer | $Al_2O_3$ | 1.74 | $0.92\lambda_0$ |
| 5th layer | $SiO_2$ | 1.51 | $0.35\lambda_0$ |
| 6th layer | $Al_2O_3$ | 1.74 | $0.46\lambda_0$ |

TABLE 7-continued $\lambda_0 = 248$ nm, incident angle 0°

| | material | ref. index (n) | opt. thickness (nd) |
|---|---|---|---|
| exit medium (substrate) | syn. quartz | 1.51 | |

TABLE 8

$\lambda_0 = 248$ nm, incident angle 0°

| | material | ref. index (n) | opt. thickness (nd) |
|---|---|---|---|
| entrance medium | air | 1.00 | |
| 1st layer | $MgF_2$ | 1.39 | $0.27\lambda_0$ |
| 2nd layer | $Al_2O_3$ | 1.74 | $0.14\lambda_0$ |
| 3rd layer | $SiO_2$ | 1.51 | $0.35\lambda_0$ |
| 4th layer | $Al_2O_3$ | 1.74 | $0.92\lambda_0$ |
| 5th layer | $SiO_2$ | 1.51 | $0.35\lambda_0$ |
| 6th layer | $Al_2O_3$ | 1.74 | $0.46\lambda_0$ |
| 7th layer | $SiO_2$ | 1.51 | $0.50\lambda_0$ |
| exit medium (substrate) | syn. quartz | 1.51 | |

In the following there will be explained other embodiments of the present invention.

Figure 8:
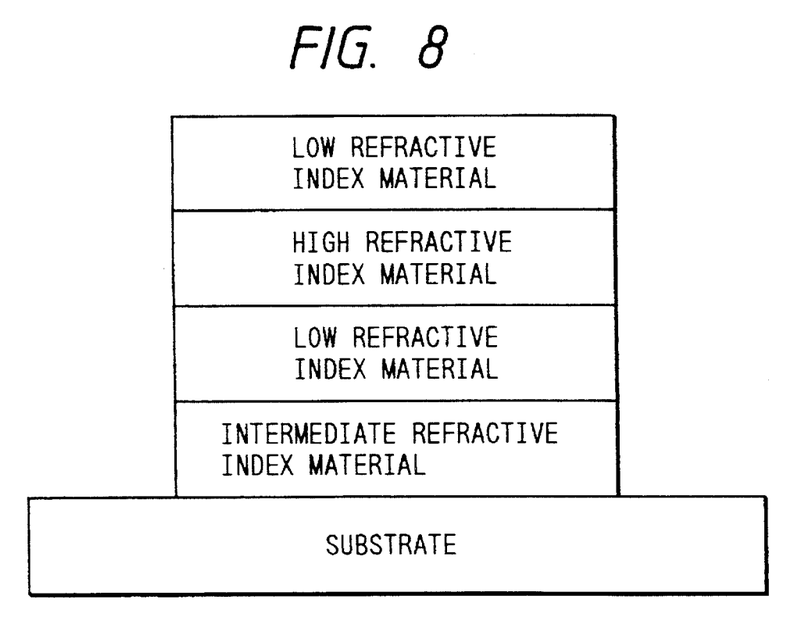
FIG. 8 is a view showing another structure of the two-wavelength antireflection film of the present invention.

The two-wavelength antireflection film of the present invention is featured, as shown in FIG. 8, by a 4-layered film laminated on a substrate, wherein the four layers are composed, in the order from the farthest side from the substrate, of a first layer of the low refractive index material, a second layer of the high refractive index material, a third layer of the low refractive index material, and a fourth layer of the intermediate refractive index material, and the optical thicknesses $D_1$, $D_2$, $D_3$, $D_4$ respectively the first, second, third and fourth layers are in the following ranges:

$0.2\lambda_0 \leq D_1 \leq 0.4\lambda_0$,
$0.04\lambda_0 \leq D_2 \leq 0.15\lambda_0$,
$0.4\lambda_0 \leq D_3 \leq 0.6\lambda_0$,
$0.4\lambda_0 \leq D_4 \leq 0.6\lambda_0$, wherein $\lambda_0$ is a design wavelength.

9th example

On a synthetic quartz substrate having a refractive index of 1.51 for the light of the wavelength of 248 nm, there were formed, in the order from the farthest side from the substrate, a 1st layer of the low refractive index material composed of $MgF_2$, a 2nd layer of the high refractive index material composed of $Y_2O_3$, a 3rd layer of the low refractive index material composed of $SiO_2$, and a 4th layer of the intermediate refractive index film composed of $Al_2O_3$, for a design wavelength $\lambda_0=248$ nm. These layers were formed by known vacuum evaporation, with materials, refractive indexes, optical thicknesses, film forming speeds and partial oxygen pressures in the film forming chamber as shown in Table 9.

TABLE 9

$\lambda_0 = 248$ nm

| | material | ref. index | optical thickness | film forming speed (nm/sec) | partial $O_2$ pres. (Pa) | note |
|---|---|---|---|---|---|---|
| entrance medium | air | 1.00 | | | | |
| 1st layer | $MgF_2$ | 1.39 | $0.32\lambda_0$ | 1.2 | none | |
| 2nd layer | $Y_2O_3$ | 2.06 | $0.07\lambda_0$ | 0.3 | 0.01 | radio frequency excited |
| 3rd layer | $SiO_2$ | 1.51 | $0.45\lambda_0$ | 1.2 | none | |
| 4th layer | $Al_2O_3$ | 1.74 | $0.47\lambda_0$ | 0.5 | 0.01 | |
| exit medium | syn. quartz | 1.51 | | | | | radio frequency excitation: freq. = 13.56 MHz, power = 100 W

This example was designed as a two-wavelength antireflection film for the light of 248 nm emitted from a KrF excimer laser and the light of 632.8 nm emitted from a He-Ne laser, and the 1st to 4th layers were formed by known vacuum evaporation. Among these layers, the 2nd layer of the high refractive index layer was formed in the presence of an electric field generated by radio frequency excitation, with a controlled film forming speed not exceeding 1 nm/sec. Also the 4th layer of the intermediate refractive index material was formed with a controlled film forming speed not exceeding 1 nm/sec.

The 2nd layer of the high refractive index material, having a thickness significantly smaller than the thickness of about $0.5\lambda_0$ in the conventional two-wavelength antireflection film, actually absorbs little energy even though it is composed of a substance easily absorbing the ultraviolet light, such as $Y_2O_3$. Moreover the absorbance can be further lowered by the provision of the radio frequency excited electric field during the film formation and by the controlled film forming speed not exceeding 1 nm/sec. as mentioned above. Also the absorbance of the 4th layer of the intermediate refractive index material can be significantly lowered by the controlled film forming speed thereof not exceeding 1 nm/sec. as mentioned above. As a result, the two-wavelength antireflection film of the present embodiment can significantly reduce the ultraviolet absorption, thereby preventing temperature increase in the lenses or mirrors of the optical system.

Figure 9:
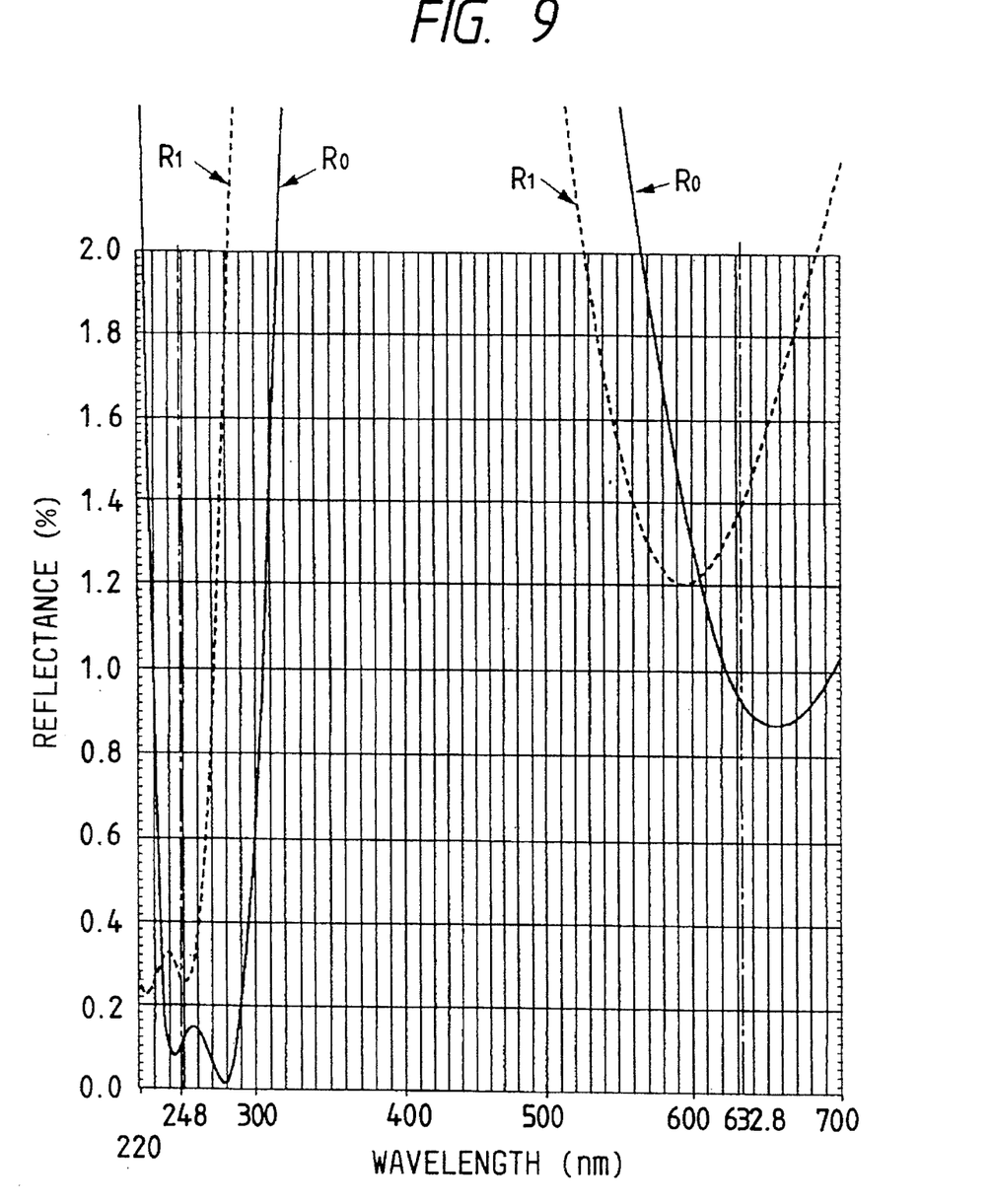
FIG. 9 is a chart showing spectral reflectance of an embodiment 9 of the two-wavelength antireflection film of the present invention.

A curve $R_0$ in FIG. 9 indicates the spectral reflectance of the two-wavelength antireflection film of the 9th example, to the light entering with an incident angle of 40°, and the aforementioned two laser wavelengths of 248 nm and 632.8 nm are still within the wavelength regions of the desired antireflective characteristics, even when the wavelength regions are displaced by such change in the incident angle. In this manner, the two-wavelength antireflection film of the present embodiment is free from a significant increase in the reflectance for the obliquely entering light, and can therefore be satisfactorily used in the optical system of the semiconductor exposure apparatus with an increased numerical aperture or an enlarged exposure area.

Figure 12:
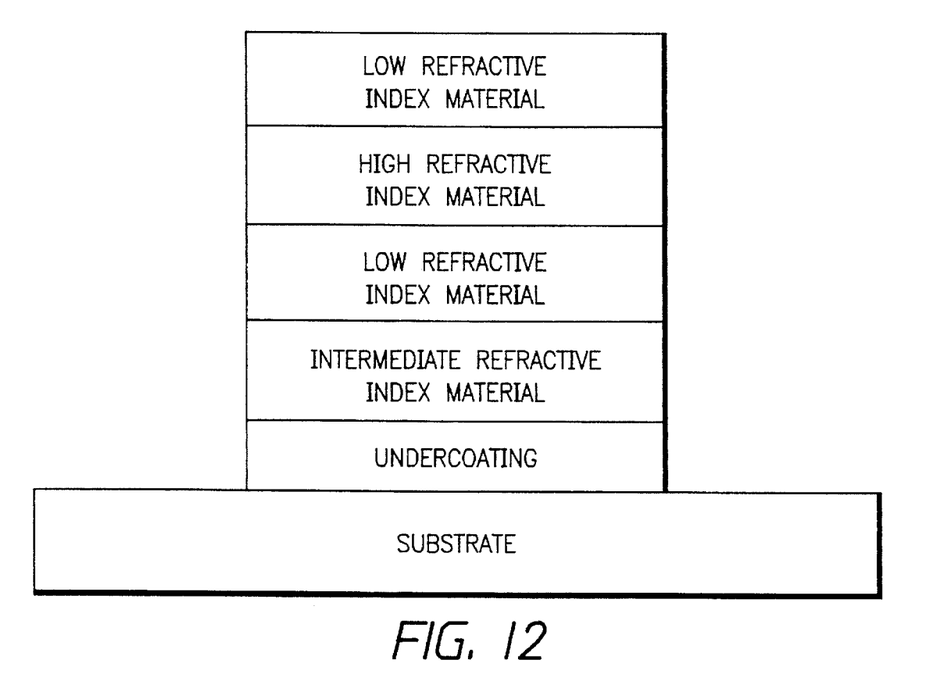
FIG. 12 is another embodiment showing four layers of films and an undercoating.

A 10th example is provided shown in FIG. 12, between the four-layered film and the substrate in the 9th example, with an undercoat layer of the low refractive index material composed of $SiO_2$, with an optical thickness of an integral multiple of about $0.5\lambda_0$, in order to improve the adhesion and durability of the multi-layered film.

Table 10 shows the materials, refractive indexes, optical thicknesses, film forming speeds and partial oxygen pressures at the film formation, in preparing such two-wavelength antireflection film of 5 layers, including the undercoat layer. The spectral reflectance and the absorbance of this example will not be explained further as they are similar to those of the foregoing example.

$MgF_2$ and $SiO_2$ also in consideration of the strength, but $BaF_2$, LiF, $SrF_2$, $AlF_3$, NaF or a mixture thereof may be employed for the same purpose. Also the film formation of the 2nd layer of the high refractive index material can also be accelerated, instead of radio-frequency excited electric field, by so-called ion assisted evaporation in which the substrate is irradiated with oxygen ions in combination with the evaporated particles of the high refractive index material. Also the absorbance can be further lowered by maintaining the partial oxygen pressure at zero during the formation of the 1st and 3rd layers of the low refractive index material, by stopping the oxygen introduction.

The optical thicknesses of the 1st layer of the low refractive index material, the 2nd layer of the high refractive index material, the 3rd layer of the low refractive index material and the 4th layer of the intermediate refractive index material may be respectively varied within ranges of $0.2\lambda_0$ to $0.4\lambda_0$, $0.04\lambda_0$ to $0.15\lambda_0$, $0.4\lambda_0$ to $0.6\lambda_0$ and $0.4\lambda_0$ to $0.6\lambda_0$. However, the desired antireflective characteristics can not be obtained outside these ranges.

11th example

On a synthetic quartz substrate same as that in the 9th example, there were formed, in the order from the farthest

TABLE 10

$\lambda_0$ = 248 nm

| | material | ref. index | optical thickness | film forming speed (nm/sec) | partial $O_2$ pres. (Pa) | note |
|---|---|---|---|---|---|---|
| entrance medium | air | 1.00 | | | | |
| 1st layer | $MgF_2$ | 1.39 | $0.32\lambda_0$ | 1.2 | none | |
| 2nd layer | $Y_2O_3$ | 2.06 | $0.07\lambda_0$ | 0.3 | 0.01 | radio frequency excited |
| 3rd layer | $SiO_2$ | 1.51 | $0.45\lambda_0$ | 1.2 | none | |
| 4th layer | $Al_2O_3$ | 1.74 | $0.47\lambda_0$ | 0.5 | 0.01 | |
| 5th layer | $SiO_2$ | 1.51 | $0.50\lambda_0$ | 1.2 | none | |
| exit medium | syn. quartz | 1.51 | | | | | radio frequency excitation: freq. = 13.56 MHz, power = 100 W

In the two-wavelength antireflection film of the present embodiment, for the high refractive index material which has a refractive index equal to or larger than 1.90 for the light of 248 nm, among such as $Y_2O_3$ or $HfO_2$, there is selected $Y_2O_3$. Also for the intermediate refractive index material which has a refractive index larger than 1.55 but smaller than 1.90 for the light of 248 nm such as $Al_2O_3$, $LaF_3$, $NdF_3$, $YF_3$ or a mixture thereof, there is selected $Al_2O_3$ in consideration of the strength. For the low refractive index material which has a refractive index equal to or smaller than 1.55 for the light of 248 nm there are selected side from the substrate, a 1st layer of the low refractive index material composed of $MgF_2$, a 2nd layer of the high refractive index material composed of $HfO_2$, a 3rd layer of the low refractive index material composed of $SiO_2$, and a 4th layer of the intermediate refractive index material composed of $Al_2O_3$, for a design wavelength of $\lambda_0$248 nm. The refractive indexes, optical thicknesses, film forming speeds and partial oxygen pressures in the film forming chamber are as shown in Table 11.

TABLE 11

$\lambda_0$ = 248 nm

| | material | ref. index | optical thickness | film forming speed (nm/sec) | partial $O_2$ pres. (Pa) | note |
|---|---|---|---|---|---|---|
| entrance medium | air | 1.00 | | | | |
| 1st layer | $MgF_2$ | 1.39 | $0.33\lambda_0$ | 1.2 | none | |
| 2nd layer | $HfO_2$ | 2.24 | $0.05\lambda_0$ | 0.3 | 0.01 | ion assisted |
| 3rd layer | $SiO_2$ | 1.51 | $0.44\lambda_0$ | 1.2 | none | |
| 4th layer | $Al_2O_3$ | 1.74 | $0.48\lambda_0$ | 0.5 | 0.01 | |

TABLE 11-continued $\lambda_0 = 248$ nm

| material | ref. index | optical thickness | film forming speed (nm/sec) | partial $O_2$ pres. (Pa) | note |
|---|---|---|---|---|---|
| exit medium | syn. quartz | 1.51 | | | | ion assisted evaporation: reaction gas = oxygen, acceleration voltage = 100 V, ion current density = 50 uA/cm$^2$ The 1st to 4th layers of the present example were formed by known vacuum evaporation, under the conditions same as those in the 9th example, except that the 2nd layer was composed of HfO$_2$ and was formed by so-called ion assisted evaporation in which the film formation was accelerated by irradiation of the substrate surface with oxygen ions.

Figure 10:
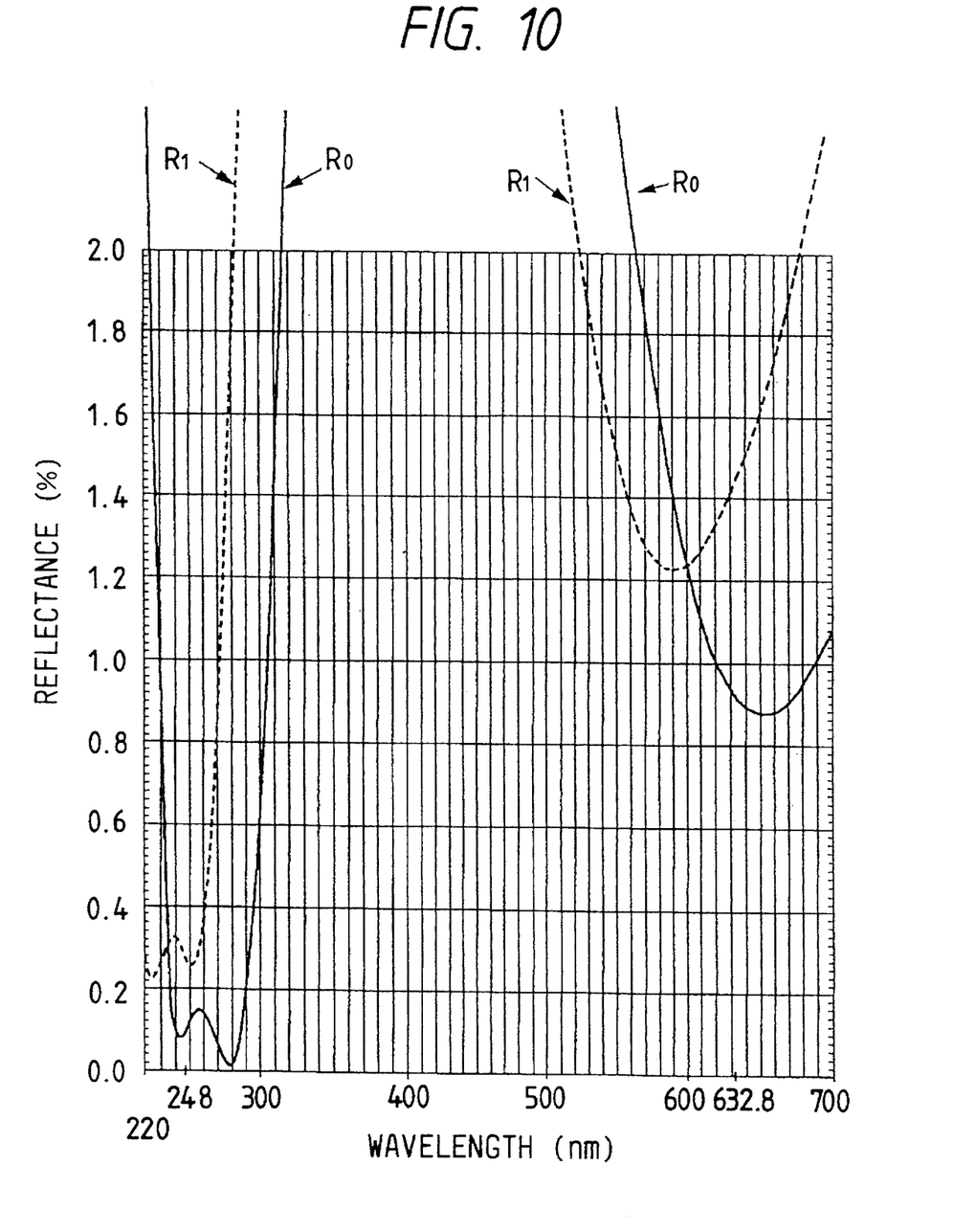
FIG. 10 is a chart showing spectral reflectance of an embodiment 10 of the two-wavelength antireflection film of the present invention.

A curve $R_0$ in FIG. 10 indicates the spectral reflectance of the 11th example to the light entering with an incident angle 0°, and it will be understood that the two-wavelength antireflection film of this example has extremely satisfactory antireflective characteristics in relatively wide two wavelength regions containing the wavelength 248 nm (design wavelength) of KrF excimer laser and the wavelength 632.8 nm of He-Ne laser, as in the antireflection film of the 9th example.

Also a curve $R_1$ in FIG. 10 indicates the spectral reflectance of the two-wavelength antireflection film of the 11th example, to the light entering with an incident angle of 40°, and the wavelengths 248 and 632.8 nm of the aforementioned lasers are still contained in the wavelength regions of the desired antireflective characteristics, even when the incident angle varies as explained above. Consequently, the two-wavelength antireflection film of the 11th example, likewise that of the 9th example, can be satisfactorily used in the optical system of the semiconductor exposure apparatus with a high numerical aperture and an enlarged exposure area.

Also, between the four-layered film and the substrate of the 11th example, there may be provided an undercoat layer of SiO$_2$, having an optical thickness of an integral multiple of about 0.5$\lambda_0$ for improving the adhesion and durability of the multi-layered film, as in the case of the 9th example. Other features of this example will be omitted as they are essentially the same as those of the 9th example.

As explained in the foregoing, the present invention provides, through suitable selection of the refractive indexes of the materials constituting the antireflection film and the film configuration, a two-wavelength antireflection film which is optically stable, shows little absorption and achieves effective antireflection, principally in two wavelength regions, namely in the ultraviolet region below 300 nm and in the visible region of 600 to 700 nm, and which is adapted for use in the optical elements (lenses and mirrors) for example in the projection exposure apparatus (stepper) for semiconductor device production.

What is claimed is:

1. A two-wavelength antireflection film comprising:

a substrate; and an alternate film consisting of alternately laminated layers of a low refractive index material and an intermediate refractive index material, in an order from a light entrance side to a surface of said substrate;

wherein said low refractive index material and said intermediate refractive index material are alternately laminated in four layers with optical thicknesses, having a design wavelength $\lambda_0$, in an order from a light entrance side, of 0.2$\lambda_0$ to 0.4$\lambda_0$ for the 1st layer, 0.05$\lambda_0$ to 0.2$\lambda_0$ for the 2nd layer, 0.2$\lambda_0$ to 0.4$\lambda_0$ for the 3rd layer, and 0.4$\lambda_0$ to 0.6$\lambda_0$ for the 4th layer.

2. A two-wavelength antireflection film according to claim 1, wherein said low refractive index material is at least a member selected from a group consisting of MgF$_2$, SiO$_2$, BaF$_2$, LiF, SrF$_2$, AlF$_3$, NaF, a mixture thereof and a compound thereof, and said intermediate refractive index material is at least a member selected from a group consisting of Al$_2$O$_3$, LaF$_3$, NdF$_3$, YF$_3$, a mixture thereof and a compound thereof.

3. A two-wavelength antireflection film according to claim 1, further comprising, next to said 4th layer, an undercoat layer of the low refractive index material, with an optical thickness of an integral multiple of about 0.5$\lambda_0$.

4. A two-wavelength antireflection film comprising:

a substrate; and an alternate film consisting of alternately laminated layers of a low refractive index material and an intermediate refractive index material, in an order from a light entrance side to a surface of said substrate;

wherein said low refractive index material and said intermediate refractive index material are alternately laminated in six layers with optical thicknesses, having a design wavelength $\lambda_0$, in an order from a light entrance side, of 0.2$\lambda_0$ to 0.4$\lambda_0$ for the 1st layer, 0.05$\lambda_0$ to 0.2$\lambda_0$ for the 2nd layer, 0.2$\lambda_0$ to 0.4$\lambda_0$ for the 3rd layer, 0.9$\lambda_0$ to 1.1$\lambda_0$ for the 4th layer, 0.2$\lambda_0$ to 0.4$\lambda_0$ for the 5th layer, and 0.4$\lambda^0$ to 0.6$\lambda^0$ for the 6th layer.

5. A two-wavelength antireflection film according to claim 4, further comprising, next to said 6th layer, an undercoat layer of the low refractive index material, with an optical thickness of an integral multiple of about 0.5$\lambda_0$.

6. A two-wavelength antireflection film comprising:

a substrate; and a four-layered film laminated on said substrate and consisting, in an order from a farthest side from a surface of said substrate, of a 1st layer of a low refractive index material, a 2nd layer of a high refractive index material, a 3rd layer of a low refractive index material, and a 4th layer of an intermediate refractive index material, wherein optical thicknesses $D_1$, $D_2$, $D_3$ and D4 layers are in ranges of:

$0.2\lambda_0 \leq D_1 \leq 0.4\lambda_0$, $0.4\lambda_0 \leq D_2 \leq 0.15\lambda_0$, $0.4\lambda_0 \leq D_3 \leq 0.6\lambda_0$, $0.4\lambda_0 \leq D_4 \leq 0.6\lambda_0$, wherein $\lambda_0$ is a design wavelength.

7. A two-wavelength antireflection film according to claim 6, wherein said low refractive index material is MgF$_2$ or SiO$_2$, said high refractive index material is Y$_2$O$_3$ or HfO$_2$, and said intermediate refractive index material is Al$_2$O$_3$.

8. A two-wavelength antireflection film according to claim 6, further comprising, between said multi-layered film and said substrate, an undercoat layer of the low refractive index material with an optical thickness of an integral multiple of $0.5\lambda_0$.

9. A two-wavelength antireflection film according to claim 6, wherein the layer of said high refractive index material is formed in a presence of an electric field generated by radio-frequency excitation.

10. A two-wavelength antireflection film according to claim 6, wherein the layer of said high refractive index material is formed by ion assisted evaporation employing oxygen ions.

11. A two-wavelength antireflection film according to claim 6, wherein the layers of said low refractive index material are formed without oxygen gas introduction.

12. A two-wavelength antireflection film according to claim 6, wherein the layers of said intermediate and high refractive index materials are formed with film forming speeds not exceeding 1 nm/sec.

13. A two-wavelength antireflection film according to claim 4, wherein said low refractive index material is at least a member selected from a group consisting of $MgF_2$, $SiO_2$, $BaF_2$, $LiF$, $SrF_2$, $AlF_3$, $NaF$, a mixture thereof and a compound thereof, and said intermediate refractive index material is at least a member selected from a group consisting of $Al_2O_3$, $LaF_3$, $NdF_3$, $YF_3$, a mixture thereof and a compound thereof.

* * * * *

UNITED STATES PATENT AND TRADEMARK OFFICE
CERTIFICATE OF CORRECTION

PATENT NO. : 5,532,871

DATED : July 2, 1996

INVENTOR(S) : SHIGERU HASHIMOTO ET AL.   Page 1 of 3

It is certified that error appears in the above-identified patent and that said Letters Patent is hereby corrected as shown below:

On the title page, item

[56] REFERENCES CITED

Foreign Patent Documents,
"2127601" should read --2-127601--.

COLUMN 1

Line 33, "example" should read --example,--.

COLUMN 2

Line 37, "layer,thereby" should read --layer, thereby--.
Line 50, "thickness" should read --thicknesses--.
Line 65, "$Y_2O$," should read --$Y_2O_3$,--.

COLUMN 3

Line 41, "and" should be deleted.

COLUMN 4

Line 56, "case" should read --the case--.

COLUMN 5

Line 12, "that" should read --those-- and "was" should read --were--.

COLUMN 7

Line 60, "respectively" should read --respectively of--.

UNITED STATES PATENT AND TRADEMARK OFFICE
CERTIFICATE OF CORRECTION

PATENT NO. : 5,532,871
DATED : July 2, 1996
INVENTOR(S) : SHIGERU HASHIMOTO ET AL.

It is certified that error appears in the above-identified patent and that said Letters Patent is hereby corrected as shown below:

COLUMN 8

Line 42, "layer" should read --material--.

COLUMN 10

Line 5, "ion assisted" should read --ion-assisted--.
Line 22, "same" should read --the same--.
Line 49, "$\lambda_o 248$ nm." should read --$\lambda_o=248$ nm.--.

COLUMN 11

Table 11, "ion assisted" should read --ion-assisted--.
Line 14, "same" should read --the same--.
Line 16, "ion assisted" should read --ion-assisted--.
Line 31, "248" should read --245 nm--.
Line 55, "mirrors)" should read --mirrors),--.
Line 56, "example" should read --example,--.

COLUMN 12

Line 42, "$0.4\lambda^o$ to $0.6\lambda^o$" should read --$0.4\lambda_o$ to $0.6\lambda_o$--.
Line 56, "D4 layers" should read --$D_4$ respectively of said 1st, 2nd, 3rd and 4th layers--.
Line 59, "$0.4\lambda_o \leq D_2 \leq 0.15\lambda_o,$" should read --$0.04\lambda_o \leq D_2 \leq 0.15\lambda_o,$--.

UNITED STATES PATENT AND TRADEMARK OFFICE
CERTIFICATE OF CORRECTION

PATENT NO. : 5,532,871
DATED : July 2, 1996
INVENTOR(S) : SHIGERU HASHIMOTO ET AL.     Page 3 of 3

It is certified that error appears in the above-identified patent and that said Letters Patent is hereby corrected as shown below:

<u>COLUMN 13</u>

Line 5, "$0.5\lambda_o.$" should read --about $0.5\lambda_o.$--.
Line 12, "ion assisted" should read --ion-assisted--.

Signed and Sealed this

Seventh Day of January, 1997

Attest:

BRUCE LEHMAN

*Attesting Officer*     *Commissioner of Patents and Trademarks*